US012653057B2

(12) United States Patent (10) Patent No.: US 12,653,057 B2

Murayama (45) Date of Patent: Jun. 9, 2026

(54) SEMICONDUCTOR DEVICE

(71) Applicant: SHINKO ELECTRIC INDUSTRIES CO., LTD., Nagano (JP)

(72) Inventor: Kei Murayama, Nagano (JP)

(73) Assignee: SHINKO ELECTRIC INDUSTRIES CO., LTD., Nagano (JP)

( * ) Notice: Subject to any disclaimer, the term of this patent is extended or adjusted under 35 U.S.C. 154(b) by 409 days.

(21) Appl. No.: 18/392,048

(22) Filed: Dec. 21, 2023

(65) Prior Publication Data

US 2025/0079379 A1 Mar. 6, 2025

(30) Foreign Application Priority Data

Sep. 6, 2023 (JP) ................................. 2023-144388

(51) Int. Cl.
H10W 72/20 (2026.01)
H10W 42/00 (2026.01)
(Continued)

(52) U.S. Cl.
CPC ........... H10W 72/20 (2026.01); H10W 72/90 (2026.01); *H10W 72/07254* (2026.01); *H10W 72/221* (2026.01); *H10W 72/227* (2026.01); *H10W 72/232* (2026.01); *H10W 72/234* (2026.01); *H10W 72/244* (2026.01); *H10W 72/247* (2026.01); *H10W 72/252* (2026.01); *H10W 72/30* (2026.01); *H10W 72/851* (2026.01); *H10W 72/922* (2026.01); *H10W 72/926* (2026.01); *H10W 72/932* (2026.01); *H10W 72/936* (2026.01); *H10W 74/15* (2026.01);
(Continued)

(58) Field of Classification Search
CPC . H10W 72/072; H10W 72/90; H10W 72/244; H10W 72/247; H10W 72/851; H10W 72/922; H10W 72/926; H10W 72/936; H10W 90/724; H10W 90/734
See application file for complete search history.

(56) References Cited

U.S. PATENT DOCUMENTS

2007/0297157 A1* 12/2007 Tanaka ................... H05K 1/162
257/E23.079
2008/0128902 A1* 6/2008 Chung .................. H10W 70/65
257/E23.021
(Continued)

FOREIGN PATENT DOCUMENTS

JP 2001-230343 8/2001

*Primary Examiner* — Mohsen Ahmadi
(74) *Attorney, Agent, or Firm* — IPUSA, PLLC

(57) ABSTRACT

A semiconductor device includes a semiconductor element provided on a wiring board including a first signal pad, and a pair of first ground pads spaced apart from the first signal pad, arranged so as to sandwich the first signal pad and oppose each other in a plan view. The semiconductor element includes a second signal pad, and a pair of second ground pads spaced apart from the second signal pad and sandwiching the second signal pad and oppose each other. The second signal pad includes a first bump electrically connected to the first signal pad through a first bonding part. The pair of second ground pads includes second and third bumps. The third bump is closer to the second signal pad than the second bump, and at least the second bump is electrically connected to each of the pair of first ground pads through a second bonding part.

7 Claims, 4 Drawing Sheets

(51) Int. Cl.
|  |  |
|---|---|
| *H10W 70/65* | (2026.01) |
| *H10W 72/00* | (2026.01) |
| *H10W 72/30* | (2026.01) |
| *H10W 72/90* | (2026.01) |
| *H10W 74/15* | (2026.01) |
| *H10W 90/00* | (2026.01) |

(52) U.S. Cl.
CPC ........ *H10W 90/724* (2026.01); *H10W 90/734* (2026.01)

(56) References Cited

U.S. PATENT DOCUMENTS

| | | | | |
|---|---|---|---|---|
| 2012/0250281 A1* | 10/2012 | Kawai | .................... | H05K 3/427 |
| | | | | 29/829 |
| 2013/0020116 A1* | 1/2013 | Mano | ................... | H05K 3/4602 |
| | | | | 174/250 |
| 2014/0027165 A1* | 1/2014 | Morita | ................. | H05K 3/4673 |
| | | | | 174/258 |
| 2014/0118976 A1* | 5/2014 | Yoshikawa | .......... | H05K 3/4602 |
| | | | | 361/761 |
| 2014/0167292 A1* | 6/2014 | Masumura | ........... | H10W 90/00 |
| | | | | 257/784 |
| 2019/0318990 A1* | 10/2019 | Nakagawa | ........... | H10W 20/42 |
| 2023/0089615 A1* | 3/2023 | Agawa | ................... | H01G 2/065 |
| | | | | 257/532 |
| 2023/0147912 A1* | 5/2023 | Kim | ...................... | H05K 1/113 |
| | | | | 174/262 |
| 2023/0154839 A1* | 5/2023 | Tsuchiya | .............. | H10W 70/65 |
| | | | | 257/774 |
| 2024/0071997 A1* | 2/2024 | Baek | .................... | H10W 90/00 |
| 2024/0179925 A1* | 5/2024 | Sung | .................... | H10B 80/00 |
| 2024/0186290 A1* | 6/2024 | Kim | ................... | H10W 74/117 |

* cited by examiner 302d   302c          40

40

SEMICONDUCTOR DEVICE

CROSS-REFERENCE TO RELATED APPLICATIONS

This application is based upon and claims priority to Japanese Patent Application No. 2023-144388, filed on Sep. 6, 2023, the entire contents of which are incorporated herein by reference.

FIELD

Certain aspects of the embodiments discussed herein are related to semiconductor devices.

BACKGROUND

Conventionally, a semiconductor device that processes high-frequency (or radio frequency) waves, such as milli-meter waves or the like, is known. In such a semiconductor device, a semiconductor element is provided on a wiring board having interconnect patterns, for example. The inter-connect patterns and the semiconductor element are electri-cally connected through bumps, for example. An example of such a semiconductor device is proposed in Japanese Laid-Open Patent Publication No. 2001-230343, for example.

In the semiconductor device that processes high-fre-quency waves, the interconnect patterns are preferably arranged so as not to generate signal transmission loss in the wiring board.

SUMMARY

Accordingly, it is an object in one aspect of the embodi-ments to provide a semiconductor device capable of reduc-ing signal transmission loss.

According to one aspect of the embodiments, a semicon-ductor device includes a wiring board; and a semiconductor element provided on the wiring board, wherein the wiring board includes, on a surface thereof opposing the semicon-ductor element, a first signal pad, and a pair of first ground pads spaced apart from the first signal pad, arranged so as to sandwich the first signal pad and oppose each other in a plan view, the semiconductor element includes, on a surface thereof opposing the wiring board, a second signal pad, and a pair of second ground pads spaced apart from the second signal pad, arranged so as to sandwich the second signal pad and oppose each other in the plan view, the second signal pad includes a first bump that is formed thereon, wherein the first bump is electrically connected to the first signal pad through a first bonding part, the pair of second ground pads includes a second bump and a third bump that are formed thereon, respectively, wherein the third bump is arranged at a position closer to the second signal pad than the second bump is to the second signal pad, and at least the second bump is electrically connected to one of the pair of first ground pads through a second bonding part, a portion of the second bonding part is arranged at a position closer to the first signal pad than each of the pair of first ground pads is to the first signal pad, and a distance between the first signal pad and the second bonding part in the plan view is smaller than a distance between the first signal pad and each of the pair of first ground pads in the plan view.

The object and advantages of the embodiments will be realized and attained by means of the elements and combi-nations particularly pointed out in the claims.

It is to be understood that both the foregoing general description and the following detailed description are exem-plary and explanatory and not restrictive of the invention, as claimed.

DESCRIPTION OF EMBODIMENTS

Figure 1A:
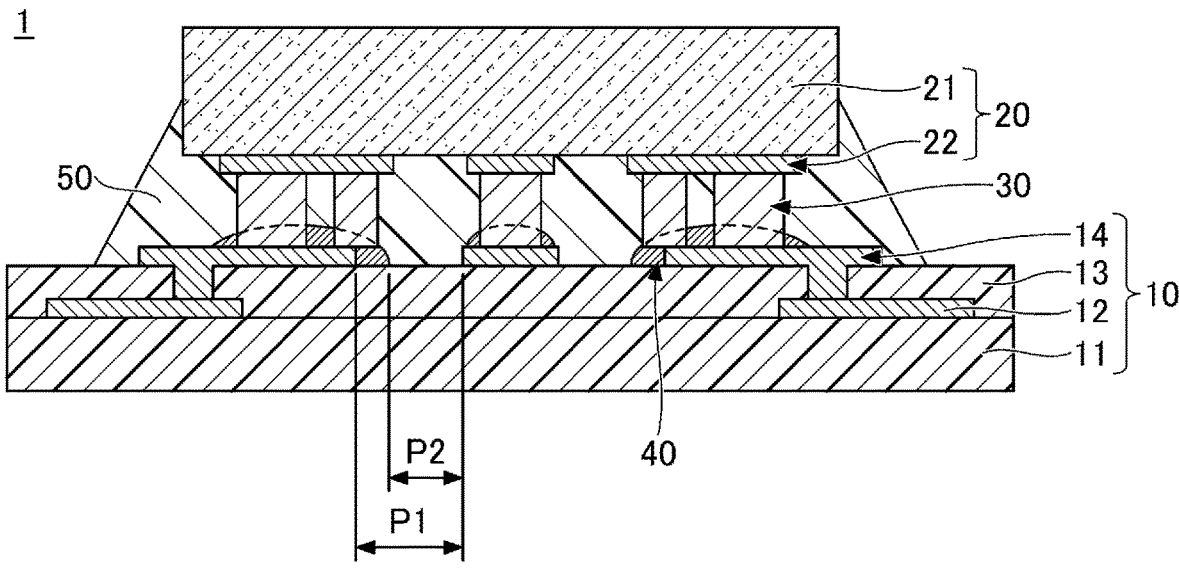
FIG. 1A, FIG. 1B, and FIG. 1C are diagram illustrating an example of a semiconductor device according to a first embodiment.

Preferred embodiments of the present invention will be described with reference to the accompanying drawings. In the drawings, those constituent elements that are the same are designated by the same reference numerals, and a repeated description of the same constituent elements may be omitted.

First Embodiment

Figure 1B:
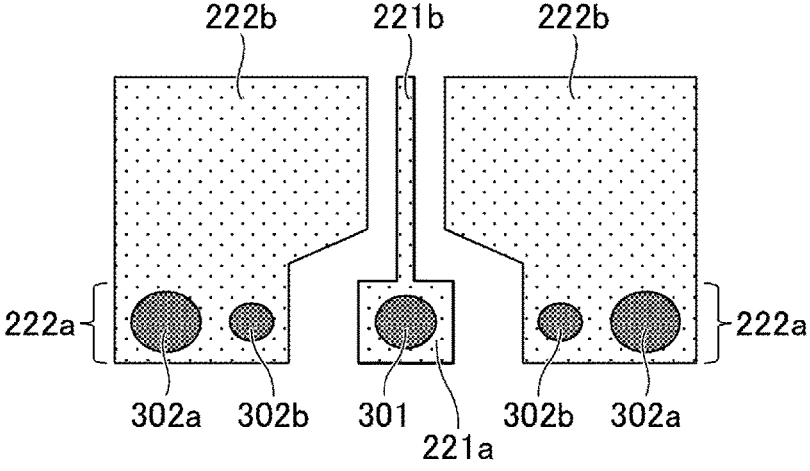
Figure 1C:
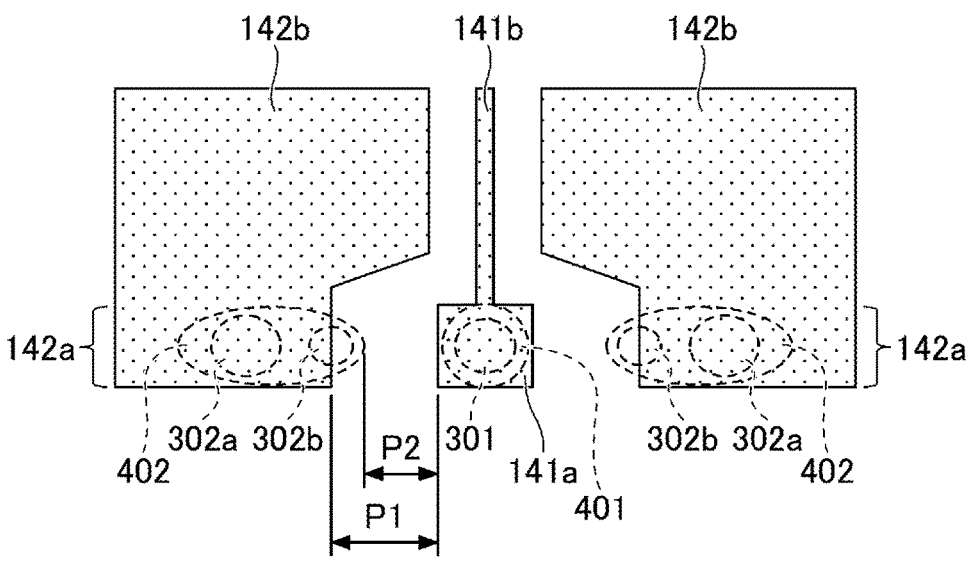

FIG. 1A, FIG. 1B, and FIG. 1C are diagram illustrating an example of a semiconductor device according to a first embodiment. FIG. 1A is a cross sectional view of the semiconductor device. FIG. 1B is a bottom view of a side of a semiconductor element 20 opposing a wiring board 10, mainly illustrating an interconnect layer 22. FIG. 1C is a plan view illustrating a side of the wiring board 10 opposing the semiconductor element 20, mainly illustrating an inter-connect layer 14.

As illustrated in FIG. 1A through FIG. 1C, a semicon-ductor device 1 includes the wiring board 10, the semicon-ductor element 20, bumps 30, bonding parts 40, and an underfill resin 50.

For the sake of convenience, in the present embodiment, the side of the semiconductor element 20 of the semicon-ductor device 1 in FIG. 1A may also be referred to as "an upper side" or "one side", and the side of the wiring board 10 of the semiconductor device 1 in FIG. 1A may also be referred to as "a lower side" or "the other side". In addition, the surface of each portion on the side of the semiconductor element 20 is referred to as "an upper surface" or "one surface", and the surface of each portion on the side of the wiring board 10 is referred to as "a lower surface" or "the other surface". However, the semiconductor device 1 may be used in an upside-down state, or at an inclined state inclined at an arbitrary angle. Moreover, a plan view of an object refers to a view of the object viewed from above in a normal direction to the upper surface of the semiconductor element 20, and a planar shape of the object refers to a shape of the object in the plan view viewed from above in the normal direction to the upper surface of the semiconductor element 20.

The wiring board 10 includes an insulating layer 11, an interconnect layer 12, an insulating layer 13, and an interconnect layer 14.

A material used for the insulating layer 11 may be a non-photosensitive epoxy-based insulating resin, a non-photosensitive polyimide-based insulating resin, or the like, for example. The material used for the insulating layer 11 may be a thermosetting resin, for example. The material used for the insulating layer 11 may also be a photosensitive epoxy-based insulating resin, a photosensitive acrylic-based insulating resin, or the like, for example. The insulating layer 11 may have a thickness in a range of approximately 20 μm to approximately 40 μm, for example. The insulating layer 11 may include a filler, such as silica (SiO$_2$) or the like.

The interconnect layer 12 is formed on the insulating layer 11. A material used for the interconnect layer 12 may be copper or the like, for example. The interconnect layer 12 may have a thickness in a range of approximately 10 μm to approximately 20 μm, for example.

The insulating layer 13 is formed on the insulating layer 11, so as to cover an upper surface and a side surface of the interconnect layer 12. A material used for the insulating layer 13 may be the same as the material used for the insulating layer 11, for example. The insulating layer 13 may have a thickness in a range of approximately 20 μm to approximately 40 μm, for example. The insulating layer 13 may include a filler, such as silica (SiO$_2$) or the like.

The interconnect layer 14 is formed on the insulating layer 13. The interconnect layer 14 includes a via interconnect filling an inside of a via hole that penetrates the insulating layer 13 and exposes the upper surface of the interconnect layer 12, and a pad and an interconnect pattern formed on the upper surface of the insulating layer 13. The interconnect layer 14 is electrically connected to the interconnect layer 12 exposed at the bottom of the via hole. The interconnect pattern forming the interconnect layer 14 may have a thickness in a range of approximately 10 μm to approximately 20 μm, for example.

The semiconductor element 20 is provided on the wiring board 10. The semiconductor element 20 is an element that processes a high-frequency signal in a terahertz (THz) band, a high-frequency signal in a submillimeter wave band, and a high-frequency signal in a millimeter wave band or higher, for example.

The semiconductor element 20 includes a semiconductor substrate 21 and an interconnect layer 22. The semiconductor substrate 21 is a substrate made of Si, GaAs, GaN, or the like, for example. The interconnect layer 22 is formed on a lower surface of the semiconductor substrate 21. The interconnect layer 22 includes a pad and an interconnect pattern.

The bumps 30 are formed on the pads of the interconnect layer 22. The bumps 30 are electrically connected to corresponding pads of the interconnect layer 14 through the bonding parts 40. The underfill resin 50 is filled between the semiconductor substrate 21 and the upper surface of the wiring board 10.

Next, the interconnect layer 14 of the wiring board 10, and the interconnect layer 22 of the semiconductor element 20, will be described in more detail.

As illustrated in FIG. 1C, the interconnect layer 14 includes a first signal pad 141a, and a first interconnect pattern 141b extending from the first signal pad 141a. In addition, the interconnect layer 14 includes a pair of first ground pads 142a, and a second interconnect pattern 142b extending from each of the first ground pads 142a. The first ground pads 142a are spaced apart from the first signal pad 141a, and are arranged so as to sandwich the first signal pad 141a and oppose each other in the plan view.

The second interconnect patterns 142b are spaced apart from the first interconnect pattern 141b, and are arranged so as to sandwich the first interconnect pattern 141b and oppose each other in the plan view. The first interconnect pattern 141b and the pair of second interconnect patterns 142b form a Ground Signal Ground (GSG) structure. A high-frequency signal from the semiconductor element 20 flows through the first interconnect pattern 141b.

For the sake of convenience, the positions of a first bump 301, second bumps 302a, third bumps 302b, a first bonding part 401, and second bonding part 402, which will be described later, are indicated by broken lines in FIG. 1C, together with the interconnect layer 14.

As illustrated in FIG. 1B, the interconnect layer 22 includes a second signal pad 221a, and a third interconnect pattern 221b extending from the second signal pad 221a. In addition, the interconnect layer 22 includes a pair of second ground pads 222a, and a fourth interconnect pattern 222b extending from each of the second ground pads 222a. The second ground pads 222a are spaced apart from the second signal pad 221a, and are arranged so as to sandwich the second signal pad 221a and oppose each other in the plan view. The fourth interconnect patterns 222b are spaced apart from the third interconnect pattern 221b, and are arranged so as to sandwich the third interconnect pattern 221b and oppose each other in the plan view.

As illustrated in FIG. 1B, the bumps 30 include the first bump 301, the second bumps 302a, and the third bumps 302b. Further, as illustrated in FIG. 1C, the bonding part 40 includes the first bonding part 401 and the second bonding part 402.

The first bump 301 is formed on the second signal pad 221a, and the first bump 301 is electrically connected to the first signal pad 141a through the first bonding part 401. Further, the second bump 302a, and the third bump 302b arranged at a position closer to the second signal pad 221a than the second bump 302a, are formed on each of the second ground pads 222a. At least the second bump 302a is electrically connected to the first ground pad 142a through the second bonding part 402, on the respective sides of the first bonding part 401.

The electrical connection between the first ground pad 142a and the second ground pad 222a can be positively and reliably achieved by the second bump 302a and the second bonding part 402. For this reason, the third bump 302b may or may not be connected to the second bonding part 402. That is, between the second bump 302a and the third bump 302b, it is sufficient that at least the second bump 302a is electrically connected to the first ground pad 142a through the second bonding part 402. However, the second bonding part 402 needs to be connected to the first ground pad 142a.

The first bump 301, the second bumps 302a, and the third bumps 302b are metal posts, for example. The metal posts may be copper posts, for example. The first bump 301, the second bumps 302a, and the third bumps 302b have a columnar shape, for example. In the present embodiment, the first bump 301, the second bumps 302a, and the third bumps 302b have a cylindrical shape. A diameter of the first bumps 301 is equal to diameters of the second bumps 302a. Diameters of the third bumps 302b are smaller than the diameters of the second bumps 302a. In this case, by making the diameters of the third bumps 302b smaller than the diameters of the second bumps 302a, two bumps can be provided even if the second ground pad 222a has a small area.

A material used for the first bonding part 401 and the second bonding part 402 may be solder, for example. Examples of the solder material include alloys including Pb, alloys of Sn and Cu, alloys of Sn and Bi, alloys of Sn and Ag, alloys of Sn, Ag, and Cu, or the like, for example.

A part of the second bonding part 402 is arranged at a position closer to the first signal pad 141*a* than the first ground pad 142*a*. Further, in the plan view, a distance P2 between the first signal pad 141*a* and the second bonding part 402 is smaller than a distance P1 between the first signal pad 141*a* and the first ground pad 142*a*. The distance P1 may be approximately 50 μm, for example, and the distance P2 may be approximately 30 μm, for example.

Figure 2:
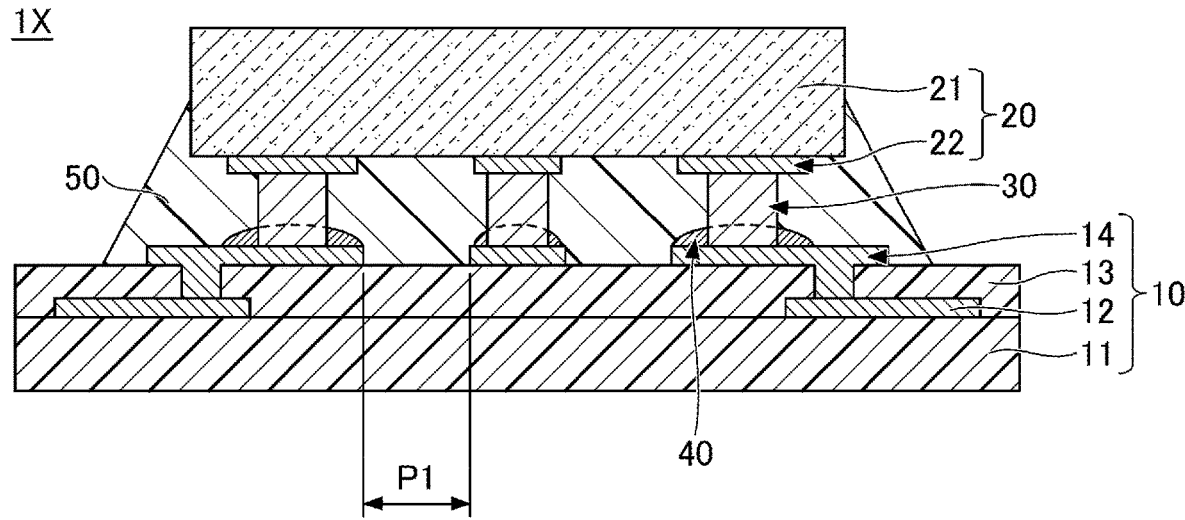
FIG. 2 is a cross sectional view illustrating an example of a semiconductor device according to a comparative example.

FIG. 2 is a cross sectional view illustrating an example of a semiconductor device according to a comparative example. In a semiconductor device 1X, each pad of the interconnect layer 22 and each pad of the interconnect layer 14 are electrically connected by a single bump 30. In addition, the bonding part 40 does not protrude from each pad of the interconnect layer 14, and the distance between adjacent pads forming the interconnect layer 14 is P1.

Because a high-frequency signal flows through the interconnect layer 14, it is more preferable that the distance P1 is small. The smaller the distance P1 is, the more the transmission loss of the high-frequency signal can be reduced. However, because the smallest value of the distance P1 is determined by a design rule of the wiring board 10, the distance P1 cannot be made smaller than the smallest value determined by the design rule. The design rule of the wiring board 10 is determined by the material forming the wiring board 10 and the process forming the interconnect layer 14.

On the other hand, because the interconnect layer 22 of the semiconductor element 20 is formed by a semiconductor process, fine interconnects can be formed, and a distance between the second signal pad 221*a* and the second ground pad 222*a* can be made smaller than the distance P1. Hence, as illustrated in FIG. 1B, in the semiconductor device 1, the distance between the second signal pad 221*a* and the second ground pad 222*a* in the plan view is made smaller than the distance P1 between the first signal pad 141*a* and the first ground pad 142*a* in the plan view, and two bumps (the second bump 302*a* and the third bump 302*b*) are arranged on each of the second ground pads 222*a*.

Accordingly, it possible to provide the lower end of the third bump 302*b* at a position even closer to the first signal pad 141*a*, and to cause the second bonding part 402 provided near the lower end of the third bump 302*b* to protrude from the first ground pad 142*a* toward the first signal pad 141*a*. The distance P2 can thus be made smaller than the distance P1. That is, the semiconductor device 1 can obtain effects similar to the effects obtainable in the case where the distance P1 is made small, and can further reduce the transmission loss of the high-frequency signal when compared to the semiconductor device 1X illustrated in FIG. 2. As a result, antenna characteristics of the semiconductor device 1 can be improved when compared to the semiconductor device 1X illustrated in FIG. 2.

In the plan view, it is preferable that the third bump 302*b* partially or entirely protrudes from the first ground pad 142*a* toward the first signal pad 141*a*. In this case, it is easy to cause the second bonding part 402 provided near the lower end of the third bump 302*b* to protrude from the first ground pad 142*a* toward the first signal pad 141*a*.

Modifications of First Embodiment

In modifications of the first embodiment, examples in which the bumps or the bonding parts have different shapes will be described. In the modifications of the first embodiment, those constituent elements that are the same as the constituent elements of the first embodiment are designated by the same reference numerals, and a repeated description of the same constituent elements may be omitted.

Figure 3A:
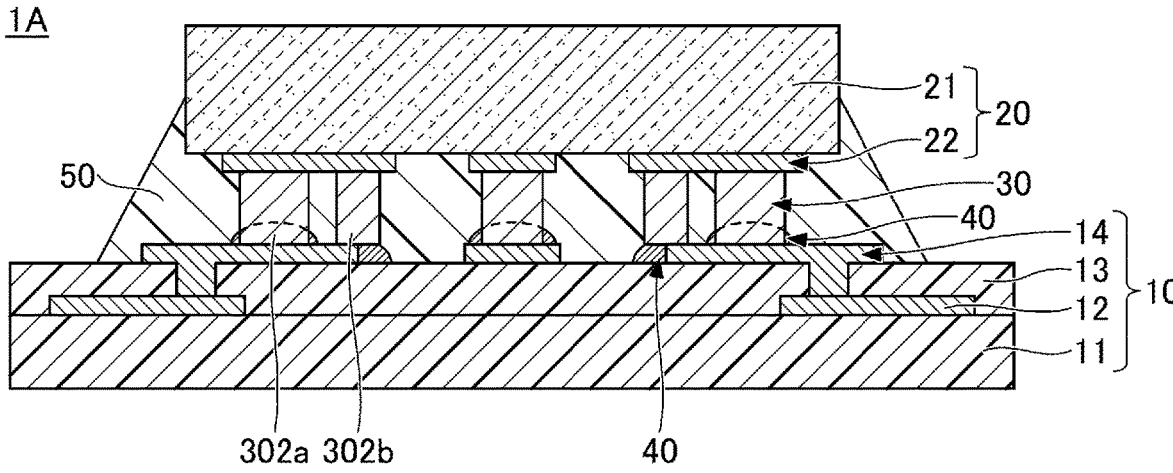
FIG. 3A and FIG. 3B are diagrams illustrating an example of the semiconductor device according to a first modification of the first embodiment.
Figure 3B:
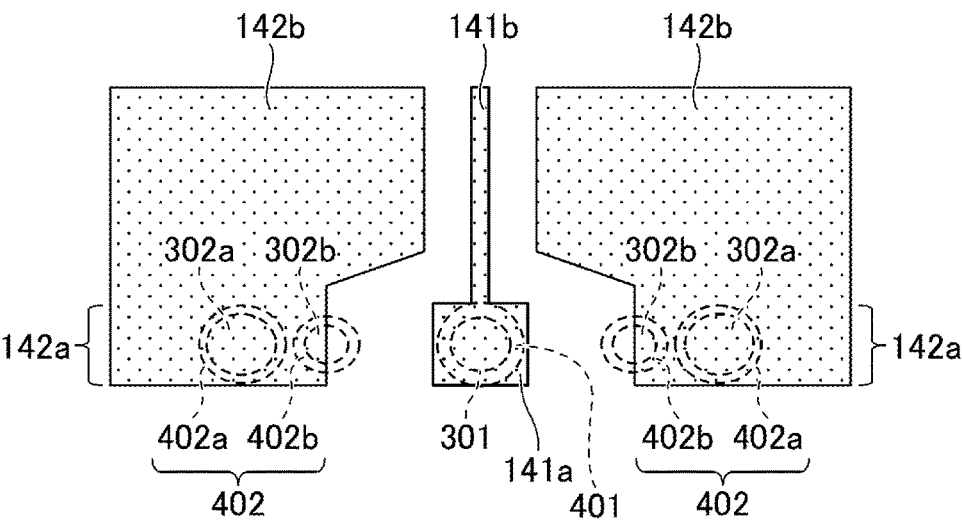

FIG. 3A and FIG. 3B are diagrams illustrating an example of the semiconductor device according to a first modification of the first embodiment. In a semiconductor device 1A illustrated in FIG. 3A and FIG. 3B, the second bonding part 402 includes a first portion 402*a* connected to the second bump 302*a*, and a second portion 402*b* connected to the third bump 302*b*. The first portion 402*a* and the second portion 402*b* are spaced apart from each other, and do not make contact with each other. The second bonding part 402 may be divided into a plurality of portions that are spaced apart from one another, as in this example.

The electrical connection between the first ground pad 142*a* and the second ground pad 222*a* can be positively and reliably achieved by the second bump 302*a* and the first portion 402*a*. For this reason, the third bump 302*b* may or may not be connected to the second portion 402*b*. However, the second portion 402*b* needs to be connected to the first ground pad 142*a*.

Figure 4:
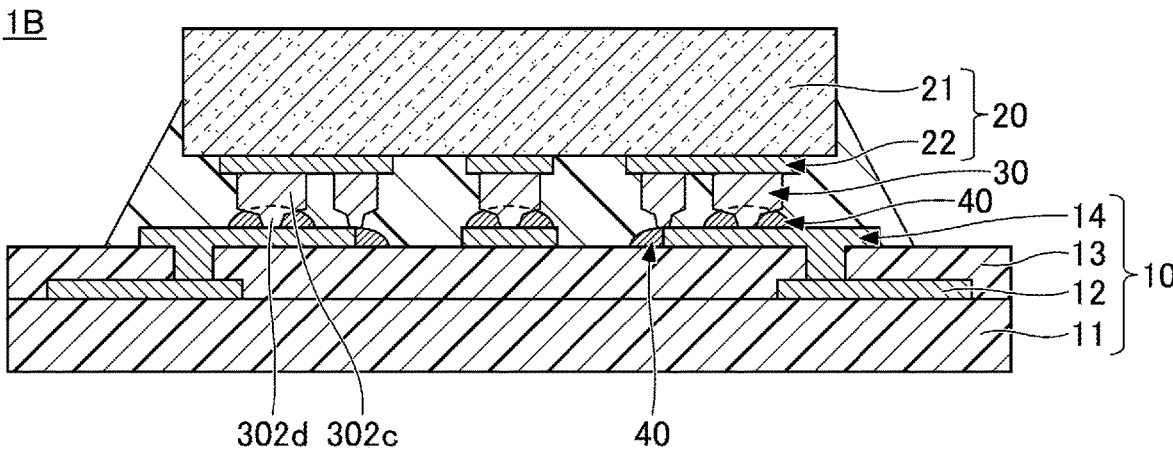
FIG. 4 is a cross sectional view illustrating an example of the semiconductor device according to a second modifica-tion of the first embodiment.

FIG. 4 is a cross sectional view illustrating an example of the semiconductor device according to a second modification of the first embodiment. In a semiconductor device 1B illustrated in FIG. 4, each bump 30 has a shape with a pointed tip end. Each bump 30 includes a wide portion 302*c* located at a position near the semiconductor element 20, and a narrow portion 302*d* projecting from the wide portion 302*c* toward the wiring board 10. Each bump 30 may have a shape other than the cylindrical shape, as in this example.

The bump 30 having the shape illustrated in FIG. 4 can be formed on the corresponding pad forming the interconnect layer 22 by a wire bump method using a metal wire, such as a gold wire or the like. More particularly, a predetermined length of the metal wire is drawn out from a capillary of a wire bonder, a tip end portion of the metal wire is rounded into a spherical shape by discharge, the capillary is thereafter lowered to cause the spherical tip end of the metal wire to make contact with the pad, and the metal wire is bonded to the pad by heating and ultrasonic vibration, for example. Next, the metal wire is fixed by a clamper while lifting the capillary upward, so as to tear the metal wire. As a result, the bump 30 having the pointed tip end, electrically connected to the pad, is formed.

Because the bump 30 has the pointed tip end, an extrusion amount of the second bonding part 402 by the bump 30 is reduced, and the possibility of generating a short-circuit between the first signal pad 141*a* and the second bonding part 402 is reduced.

Figure 5:
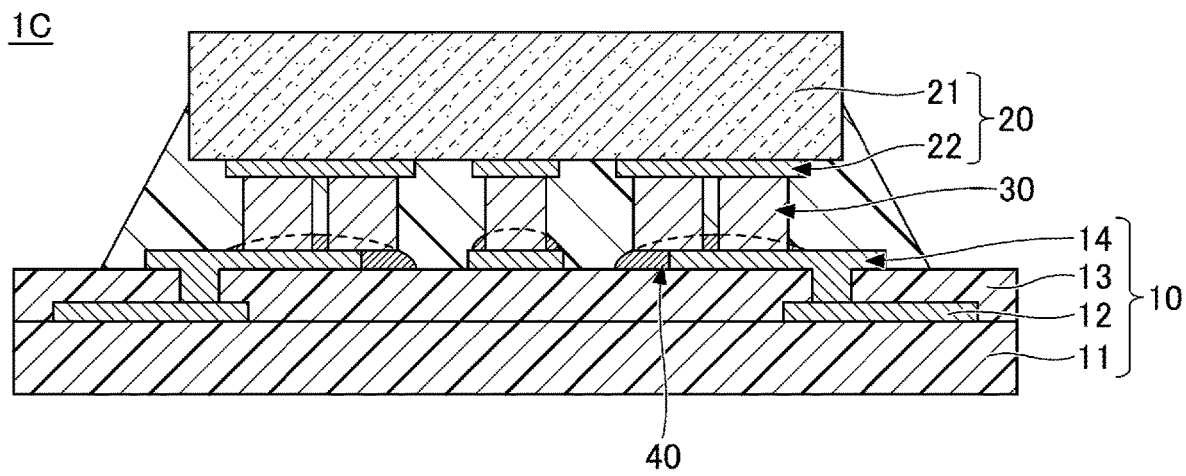
FIG. 5 is a cross sectional view illustrating an example of the semiconductor device according to a third modification of the first embodiment.

FIG. 5 is a cross sectional view illustrating an example of the semiconductor device according to a third modification of the first embodiment. In a semiconductor device 1C illustrated in FIG. 5, each bump 30 has the cylindrical shape with the same diameter. In a case where the second ground pad 222*a* has a relatively large area, the bumps 30 can have one kind of shape. In this case, because it is unnecessary to prepare the bumps 30 having a plurality of kinds of shapes, there is an advantage in that the manufacturing process can be simplified.

Accordingly to each of the embodiments and modifications described above, it is possible to provide a semiconductor device capable of reducing signal transmission loss.

Although the modifications of the embodiment are numbered with, for example, "first," "second," or "third," the ordinal numbers do not imply priorities of the modifications. Many other variations and modifications will be apparent to those skilled in the art.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A semiconductor device comprising:
a wiring board; and
a semiconductor element provided on the wiring board, wherein
the wiring board includes, on a surface thereof opposing the semiconductor element,
a first signal pad, and
a pair of first ground pads spaced apart from the first signal pad, arranged so as to sandwich the first signal pad and oppose each other in a plan view,
the semiconductor element includes, on a surface thereof opposing the wiring board,
a second signal pad, and
a pair of second ground pads spaced apart from the second signal pad, arranged so as to sandwich the second signal pad and oppose each other in the plan view,
the second signal pad includes a first bump that is formed thereon, wherein the first bump is electrically connected to the first signal pad through a first bonding part,
each of the pair of second ground pads includes a second bump and a third bump that are formed thereon, respectively, wherein the third bump is arranged at a position closer to the second signal pad than the second bump is to the second signal pad, and at least the second bump is electrically connected to one of the pair of first ground pads through a second bonding part,
a portion of the second bonding part is arranged at a position closer to the first signal pad than each of the pair of first ground pads is to the first signal pad, and
a distance between the first signal pad and the second bonding part in the plan view is smaller than a distance between the first signal pad and each of the pair of first ground pads in the plan view.

2. The semiconductor device as claimed in claim 1, wherein
the second bump and the third bump have a cylindrical shape, and
a diameter of the third bump is smaller than a diameter of the second bump.

3. The semiconductor device as claimed in claim 1, wherein
the first bump, the second bump, and the third bump have a cylindrical shape, and
the first bump, the second bump, and the third bump have identical diameters.

4. The semiconductor device as claimed in claim 1, wherein each of the first bump, the second bump, and the third bump includes a wide portion located at a position near the semiconductor element, and a narrow portion projecting from the wide portion toward the wiring board.

5. The semiconductor device as claimed in claim 1, wherein
the second bonding part includes a first portion connected to the second bump, and a second portion connected to the third bump, and
the first portion and the second portion are spaced apart from each other.

6. The semiconductor device as claimed in claim 1, wherein the third bump partially or entirely protrudes from each of the pair of first ground pads toward the first signal pad in the plan view.

7. The semiconductor device as claimed in claim 1, wherein a distance between the second signal pad and each of the pair of second ground pads in the plan view is smaller than a distance between the first signal pad and each of the pair of first ground pads in the plan view.

* * * * *